(12) United States Patent
Eitzinger

(10) Patent No.: US 7,781,015 B2
(45) Date of Patent: Aug. 24, 2010

(54) COATING METHOD

(75) Inventor: Günter Eitzinger, Timelkam (AT)

(73) Assignee: Miba Gleitlager GmbH, Laakirchen (AT)

( * ) Notice: Subject to any disclaimer, the term of this patent is extended or adjusted under 35 U.S.C. 154(b) by 781 days.

(21) Appl. No.: 11/485,570

(22) Filed: Jul. 12, 2006

(65) Prior Publication Data

US 2007/0178233 A1    Aug. 2, 2007

(30) Foreign Application Priority Data

Jul. 12, 2005   (AT) .............................. A 1168/2005

(51) Int. Cl.
*C23C 16/00* (2006.01)

(52) U.S. Cl. .................. 427/248.1; 427/250; 29/898; 29/898.042

(58) Field of Classification Search .............. 427/248.1, 427/250
See application file for complete search history.

(56) References Cited

U.S. PATENT DOCUMENTS

| | | | |
|---|---|---|---|
| 4,437,961 A | 3/1984 | Routh et al. | |
| 5,432,339 A | 7/1995 | Gordon et al. | |
| 5,955,202 A | 9/1999 | Steeg et al. | |
| 6,051,113 A | 4/2000 | Moslehi | |
| 6,113,752 A | 9/2000 | Hollstein | |
| 6,139,191 A | 10/2000 | Andler et al. | |
| 6,146,019 A | 11/2000 | Andler et al. | |
| 6,217,720 B1 | 4/2001 | Sullivan et al. | |
| 6,263,575 B1 | 7/2001 | Andler et al. | |
| 6,316,061 B1 | 11/2001 | Andler et al. | |
| 6,337,146 B1 * | 1/2002 | Sogabe et al. | ............... 428/649 |
| 6,444,086 B1 | 9/2002 | Andler et al. | |
| 2001/0024687 A1 | 9/2001 | Gartner | |
| 2004/0137279 A1 * | 7/2004 | Richter et al. | ............... 428/701 |

FOREIGN PATENT DOCUMENTS

| | | |
|---|---|---|
| DE | 29 35 417 | 3/1981 |
| DE | 36 06 529 | 9/1987 |
| DE | 195 14 835 | 1/1997 |
| DE | 197 52 322 | 12/1998 |
| DE | 197 53 656 | 12/1998 |
| DE | 198 24 310 | 8/1999 |
| DE | 198 24 308 | 9/1999 |
| DE | 198 30 223 | 11/1999 |
| DE | 195 14 836 | 6/2000 |
| DE | 101 07 288 | 9/2001 |
| GB | 2 187 207 | 9/1987 |
| JP | 52-105581 | 9/1977 |

OTHER PUBLICATIONS

Reuschling, R., "Vakuum in Forschung und Praxis," (Special), Konzepte und Komponenten für Vakuumbeschichtungsanlagen, 2004, pp. 30 and 38-41. (German OA).

* cited by examiner

*Primary Examiner*—Shamim Ahmed
(74) *Attorney, Agent, or Firm*—Collard & Roe, P.C.

(57) ABSTRACT

A coating method deposits a metal coating of particles from the gas phase on a flat, metal substrate retained by a substrate holder at a reduced pressure, and the particles are evaporated using at least one energy source from containers constituting at least one evaporation source. The metal coating is built up of several sequentially applied individual coatings.

26 Claims, 6 Drawing Sheets

COATING METHOD

CROSS REFERENCE TO RELATED APPLICATIONS

Applicant claims priority under 35 U.S.C. §119 of Austrian Application No. A 1168/2005 filed Jul. 12, 2005.

BACKGROUND OF THE INVENTION

1. Field of the Invention

The invention relates to a coating method, whereby a metal coating is deposited from a vapor flow at reduced pressure onto a flat metal substrate retained by a substrate holder, and the vapor particles are evaporated by means of at least one energy source comprising at least one container constituting an evaporation source, a strip-shaped, flat preliminary product for producing a bearing element with a metal substrate on which at least one metal layer is disposed, as well as devices for coating a flat, metal substrate in the gas phase with a metal layer formed by a vapor flow at reduced pressure, comprising a vacuum-sealed housing, a drum-shaped substrate holder, at least one electron beam evaporator for generating the vapor flow and at least one container constituting an evaporation source for the particles.

2. Prior Art

Methods of depositing metal coatings o a metal substrate under vacuum have long been known. For example, patent specification DE 195 14 835 C1 discloses a method of applying a coating to concavely curved sliding elements by vacuum deposition. To this end, a specific distance is set between the substrate and the surface of the evaporator bath. The material to be deposited is disposed in evaporator pans and is evaporated by an electron beam. As the coating is being deposited, the evaporator and the support body are moved relative to one another at a non-uniform speed. The speed of the linear movement reaches its maximum component both on entering and leaving this vapor beam. In order also to ensure that the coating thickness of the deposited coating does not deviate from the maximum coating thickness by more than 15%, parts of the vapor flow are screened with the aid of screens.

The disadvantage of this type of vapor deposition is that the coating thickness is set on the basis of several parameters which have to be adapted to one another and a relatively complex motion sequence has to be predefined, monitored and controlled. Structural measures also have to be taken in order to achieve the desired ratio of coating thickness. Moreover, if an alloy is used for the coating to be created, it must already be present in the evaporator source. Another disadvantage, amongst other things, is the fact that material can accumulate at certain points.

Patent specification DE 197 53 656 A discloses a system for vacuum coating plain bearings with at least one intermediate coating and at least one anti-friction coating, comprising a series of vacuum chambers disposed in a row one after the other and separated by vacuum valves or pressure stages, at least one vacuum chamber serving as a gating chamber for introducing the uncoated plain bearings and/or discharging the coated plain bearings into and out of the vacuum, and at least one other vacuum chamber being used to pre-treat the uncoated plain bearings by means of a plasma process, and at least one respective vacuum chamber being used to apply the intermediate coating and the anti-friction coating, as well as vacuum pumps connected to the vacuum chambers, power supply and control systems for running the coating processes and means for conveying several plain bearings on a conveyor track running through the system, and the plain bearings are positively retained in a support body, which support bodies can be heated, and the plain bearing can be pressed into the support bodies with an adjustable force, and, disposed one after the other in the conveying direction, are at least the gating chamber, a pre-treatment chamber, a first coating chamber, a second coating chamber and a gating chamber, and the control system is configured so that the support bodies can be moved at a speed which can be adapted to a part-process taking place in each vacuum chamber, and the pre-treatment chamber has an etching device for etching the friction bearings by a stationary plasma process assisted by a magnetic field, the first coating chamber has a magnetron-atomizer source in which at least one target disposed underneath and at a distance from the plain bearings is disposed and is adapted to the geometry of the plain bearings, the second coating chamber contains an electron beam evaporator with an evaporator pan, disposed at a distance from the plain bearings adapted to their geometry, and buffer regions are provided before and after the region in which the plain bearings are exposed to the electron beam vapor deposition process.

The specific disadvantage of this system is the complex structure and the need to provide specially shaped support bodies for the plain bearing shells, in view of the fact that these supports have to be specially made available for every plain bearing diameter in order to guarantee the appropriate contact pressure Other electron beam vapor deposition methods used for plain bearing shells are known from patent specifications DE 198 24 308 A and DE 198 24 310 A, for example.

SUMMARY OF THE INVENTION

The underlying objective of the present invention is to simplify a method of producing a plain bearing by means of a PVD process, thereby saving on costs whilst maintaining a constant quality at the same time.

This objective is achieved by the invention, independently in each case, due to the fact that, based on the coating process used, the metal coating is built of several individual layers applied in sequence, due to a preliminary product produced by the method whereby the metal coating is built up of several individual layers, as well as by devices for applying the coating whereby the substrate holder is connected to a heating and cooling system and a magnetron is disposed after the at least one evaporator source in the direction in which the substrate holder rotates and/or electric voltage is applied to the substrate holder beforehand and/or electrodes are conductively connected to the voltage source between the substrate holder and the at least one evaporator source in order to generate an electric field extending at least approximately perpendicular to a vapor flow between the substrate holder and the at least one evaporator source.

The main idea underlying the invention is based on the fact that, instead of adopting the standard approach used in the past whereby a coating is applied to ready formed bearing elements, a coating is now applied to a flat strip-shaped preliminary product, which does not undergo the shaping process until later. With the coating methods known to date, it is not possible to produce ductile, uniform, dense coatings without taking additional measures, such as activating the surface to be coated by means of plasma, for example, or alternatively taking special steps during finishing, such as subsequent ionization, for example. This problem becomes all the more serious if thick coatings in the range of 100 µm have to be deposited, as is now possible using the invention.

These problems are resolved by the coating method proposed by the invention, and, as already mentioned above, this coating method is not exclusively restricted to bearing elements and the production of preliminary products for them but generally enables products which require a ductile, finely structured, uniform and dense coating to be manufactured. Together with this advantage and the other advantage already explained above, namely the fact that the coating can be applied directly to the substrate, the method proposed by the invention offers another advantage because a coating to specific dimensions is not necessary because only preliminary products are produced, i.e. the fact that the amount of tolerance in variations of the coating thickness may be greater due to the subsequent shaping, in particular compression, or due to the fact that other layers may be subsequently rolled on, which means that the method as a whole and the coating plant used for this purpose can be simplified accordingly. Bearing elements can therefore be produced from these preliminary products which—from a quality point of view—extend into the range of mechanical properties obtained in bearing elements made by sputtering, but at a cost equivalent to that of so-called bimetallic bearings known from the prior art and produced in a corresponding manner. The devices proposed by the invention are also of advantage because they are of a relatively simple design, i.e. they do not require multiple gating systems to enable transport between the individual processing stations in which the preliminary products, i.e. the substrates, are disposed on drum-shaped substrate holders during the coating process, in a manner known from patent specification DE 101 07 288 A1 by this same applicant in respect of bearing half-shells, the disclosures of which are incorporated in the descriptive part of this invention. Due to the heating and/or cooling system actively connected to this substrate holder, the substrates can be heated to and maintained at a temperature level, from the start of processing up to the end of the coating process, which enables a coating to be applied directly to the substrates. This being the case, another advantage is the fact that, after depositing the metal coating, the temperature can then be increased if necessary and under certain circumstances, to permit a diffusion of least individual components within the metal coating and between the individual layers, thereby making the coating composition even more uniform and thus improving the properties of the preliminary products. Another advantage of the devices proposed by the invention is the fact that a certain degree of subsequent compaction and a selective application of ions from which the individual layers are made can be made to at least individual ones of these deposited metal individual layers in one and the same coating chamber, as a result of which the properties of the metal coating can be varied in order to adapt them to the intended purpose of the preliminary products by varying the energy or the voltage in the electric field.

Other variants of the coating method are discussed below.

For example, it is possible to deposit the individual coating on the substrate with a defined thickness, selected from a range with a lower limit of 10 nm and an upper limit of 10 µm, thereby increasing the ductility and the uniformity of the layers.

It is also of advantage to produce a metal coating with a coating thickness in excess of 100 µm, in particular in excess of 150 µm, preferably in excess of 200 µm, for example 400 µm, if the finished product is to be used for bearing elements, because this provides a sufficient coating thickness for the subsequent forming operation and the associated reduction in coating thickness, i.e. the dimensional finishing, with narrow tolerances. These thick coatings also enable a bearing element to be produced with a corresponding safety leeway before it fails due to wear.

The number of individual coatings may be selected from a range with an upper limit of 50, in particular 100, preferably 250, and an upper limit of 5000, in particular 4000, preferably 2500, because the homogeneity of the metal coating can be increased due to reduced local concentration gradients of individual coating constituents. Another advantage of this is that the coating structure can be purposely controlled on the basis of concentration gradients and it is even possible to deposit at least individual layers of a totally different composition, in which case an appropriate homogenization across the cross-section of the metal coating can be obtained by running a subsequent diffusion step.

The fact that the individual coatings are created with a surface roughness which is smaller than the surface roughness of the substrates avoids the formation of a raw, brittle surface due to local crystallite growth, which again increases the homogeneity of the coating and improves the fine structure. Adhesion of the coating to the metal substrate can also be improved as a result.

The substrate may deviate from a mean substrate thickness which is not more than 200 µm, in particular not more than 150 µm, preferably not more than 100 µm.

Due to the cyclical, in particular rotating or linear movement of the substrate above the evaporator source, in particular the same one, in addition to the actual coating phase, adequate rest phases outside of the evaporator source can be provided, i.e. the vapor beam of vapor particles generated by the latter can be made available for a diffusion of individual components of the coatings, which in turn causes a homogenization of the layers accordingly.

This being the case, the rotating movement may be superimposed on the linear movement, which means that the substrate can be coated using a screw-shaped movement, which means that larger substrates can also be coated.

As mentioned above, apart from using the at least one evaporator source, homogenization in the metal coating and between the individual coatings can be operated on the basis of a diffusion of at least individual constituents of the coating (s), and this is achieved by varying the speed at which the substrate is moved above the evaporator source, for example, or, under certain circumstances, can be influenced with the substrate totally stationary outside the evaporator source.

During these periods outside of the evaporator source, the temperature may optionally be increased and/or reduced, in which case it is of advantage if a local heating device is assigned to the individual substrates in or on the substrate holder, such as a Peltier element for example, so that individual substrates can be heated irrespective of a basic temperature in the coating chamber.

The substrate may be provided in the form of a steel strip, in which case the preliminary product produced by the coating process will have sufficient dimensional stability.

It is also of advantage to use several evaporator sources, each of which contains a chemically pure element as a target for building the coating, because this means that the coating composition can be determined exclusively on the basis of the quantity of deposited particles from these evaporation sources, i.e. the evaporator pans, and secondly, under certain circumstances, expensive or complex alloys can be dispensed with—an alloy is formed either in the gas phase or during deposition of the particles.

If the preliminary product obtained at the end of the coating process is to be used as a bearing element, it is of advantage if the metal coat is made from a two-component or multiple-component system, consisting of a base element selected from a first group comprising aluminum, tin, copper, lead, which is alloyed during the coating process with at least one other element selected from a group comprising lead, tin, bismuth, zinc, silicon, magnesium, manganese, iron, scandium, zirconium, chromium, copper, aluminum, beryllium, provided that the alloying element is not the same as the base element.

As mentioned above, alloys may be formed from these components, in which case this alloy formation takes place in the gas phase or during deposition of the individual components on the metal substrate or optionally during a subsequent reaction or diffusion outside of the evaporator source, so that the alloy composition can be selectively controlled on the basis of the energy to be applied during the coating method.

Alternatively, however, it would also be possible for these components to be deposited individually, one after the other, in individual layers, which, on the one hand, would enable a type of sandwich structure to be obtained, for example, which, microscopically, may consist of different individual layers but, macroscopically, may have homogeneous properties, or alternatively, a metal layer which consists of at least approximately identical individual layers microscopically may be produced from these individual coatings by subsequent processing, e.g. subsequent diffusion, etc.

If the preliminary product produced as a result is to be used as a bearing element, an additional coating may be applied to the as yet uncoated surface of the substrate, to impart sufficient durability to the bearing element during use so that it will withstand corrosion due to friction.

If necessary, an adhesion-imparting coating may be applied between the metal layer and the substrate, thereby further increasing the ability of the coating to adhere to the substrate.

Using the coating method, it is also possible to produce selectively at least an outermost layer of the individual coatings with a defined porosity and, in one embodiment, pores are created for this purpose with a mean pore diameter selected from a range with a lower limit of 0.1 μm and an upper limit of 10 μm, in particular a lower limit of 0.5 μm and an upper limit of 5 μm, as a result of which a lubricant may be disposed in these pores, for example, thereby reducing friction resistance such as will occur between the bearing element and a mounted shaft if the preliminary products will be used to make a bearing element.

The coating method may be used to apply the metal layer ion the form of an anti-friction surface for a bearing element, in particular a plain bearing.

The energy source used to produce the particle flow, i.e. the vapor beam above the evaporator source, is advantageously an electron beam source because this enables selective positioning of the energy beam by magnetically deflecting the charged particles, i.e. electrons, onto the evaporator surface.

At least after applying the first individual coatings, the structure of the individual coatings can be improved by bombarding them with high-energy particles, e.g. gas particles and/or coating particles, and vibrations can be induced in the lattice structure of this/these individual coating(s) in order further to improve the ductility of the layer and its dense structure.

Alternatively or in addition, for the same purpose, it is possible for a proportion of the evaporated particles to be ionized and this can be achieved by accelerating them during the process of depositing the individual coatings by means of an electric field generated between the substrate and at least one electrode in the direction towards the surface of the substrates and the already deposited individual coatings and/or in an electric field extending between the electrodes, in order to generate the electric field at least approximately perpendicular to the particle flow between the substrate holder and the at least one evaporator source, in which case it is of advantage if a voltage used to generate the electric field is selected from a range with a lower limit of 10 V and an upper limit of 800 V, preferably with a lower limit of 50 V and an upper limit of 600 V, in particular with a lower limit of 100 V and an upper limit of 400 V, as a result of which a correspondingly high kinetic energy will be imparted to these ionized particles.

In order to improve the homogeneity of the metal coating, it is of advantage if the metal substrate is heated to a temperature which his at least 10° C. below the melting point of the element to be deposited which has the lowest melting point, thereby achieving a higher diffusion rate within the metal coating and between individual coatings which shortens the duration of the process as a whole.

It is also of advantage if the coating method is operated at a pressure selected from a range with a lower limit of $1.10^{-7}$ mbar and an upper limit of $2.10^{-2}$ mbar, preferably with a lower limit of $1.10^{-6}$ mbar and an upper limit of $2.10^{-3}$ mbar, in particular with a lower limit of $1.10^{-5}$ mbar and an upper limit of $2.10^{-4}$, and/or the coating method is operated at a deposition rate selected from a range with a lower limit of 0.01 μm/sec and an upper limit of 0.1 μm/sec, preferably with a lower limit of 0.03 μm/sec and an upper limit of 0.07 μm/sec, in particular with a lower limit of 0.05 μm/sec and an upper limit of 0.06 μm/sec, because this enables the coating structure to be created largely unaffected by external influences.

The substrate holder may be operated at a speed selected from a range with a lower limit of 0.01 m/sec and an upper limit of 10 m/sec, preferably with a lower limit of 1 m/sec and an upper limit of 7 m/sec, in particular with a lower limit of 3 m/sec and an upper limit of 6 m/sec, because the evaporated particles will have enough time to be deposited homogeneously to form the individual coatings on the substrate and the already deposited individual coatings.

Especially in view of the fact that no ready-prepared alloys are used and instead the alloy is formed by means of pure elements in the gas phase and the deposited individual coatings, it is possible to deposit meta-stable phases using the method proposed by the invention, at least in an outermost coating of the individual coatings, which, as a result, will induce or improve resistance of the bearing element to galling during operation of the finished bearing below a so-called emergency temperature, i.e. if there is a danger of seizure stress due to any friction which might have occurred or due to too high oil temperatures, these meta-stable phases undergo a phase conversion to stable phases.

To this end, these components for forming the meta-stable phases may be selected from compounds formed by elements from a group comprising tin, silver, copper, aluminum, manganese, magnesium, lead, beryllium and mixtures thereof.

It is also possible to harden at least one individual coating in contact with the substrate surface in order to increase the strength of the preliminary products and in order to obtain a "hardness gradient" in the direction from the substrate towards the metal coating, thereby avoiding jumps in hardness.

In view of the fact that several individual coatings are deposited, starting from an innermost individual coating on the substrate surface in the direction towards the outermost individual coating for at least one component, it is possible to create a concentration gradient using the coating method proposed by the invention, so that there is no abrupt transition of mechanical properties within this coating and from the substrate to the coating, which improves the properties of the preliminary products especially if it is to be used as a bearing element.

Finally, using the coating method proposed by the invention, it is possible to run processes to produce a deposited coating or at least one individual coating which, compared with the same composition used for sputter coating, has a lower hardness based on Vickers by 30%, in particular 35%, preferably 40%, thereby enabling the elongation at break to be improved.

Embodiments of the preliminary products proposed by the invention are characterized in claims 29 and 30 and the some of the effects outlined in the description given above also apply to these embodiments.

As mentioned above, an alloy may be formed between the base element and the at least one additional element, which is deposited on the metal substrate in order to form a metal coating, and this alloy may selected from a group comprising $AlSn_xCu$, $AlSn_xSi$, $AlPb_x$, $CuSn_x$, $CuBi_x$, $CuSnBi_x$, $SnAl_x$, $SnSb_x$, $AlSn_x$, $AlSi$ where x may be a value selected from a range with a lower limit of 6 and an upper limit of 30, depending on whether a hard phase or a soft phase is to be formed, so that the preliminary product can be adapted accordingly to suit the desired application, such as a large bearing or small bearing, for example.

BRIEF DESCRIPTION OF THE DRAWINGS

To provide a clearer understanding, the invention will be explained in more detail below with reference to the appended drawings. The drawings provide simplified schematic diagrams showing.

DETAILED DESCRIPTION OF PREFERRED EMBODIMENTS

Figure 1:
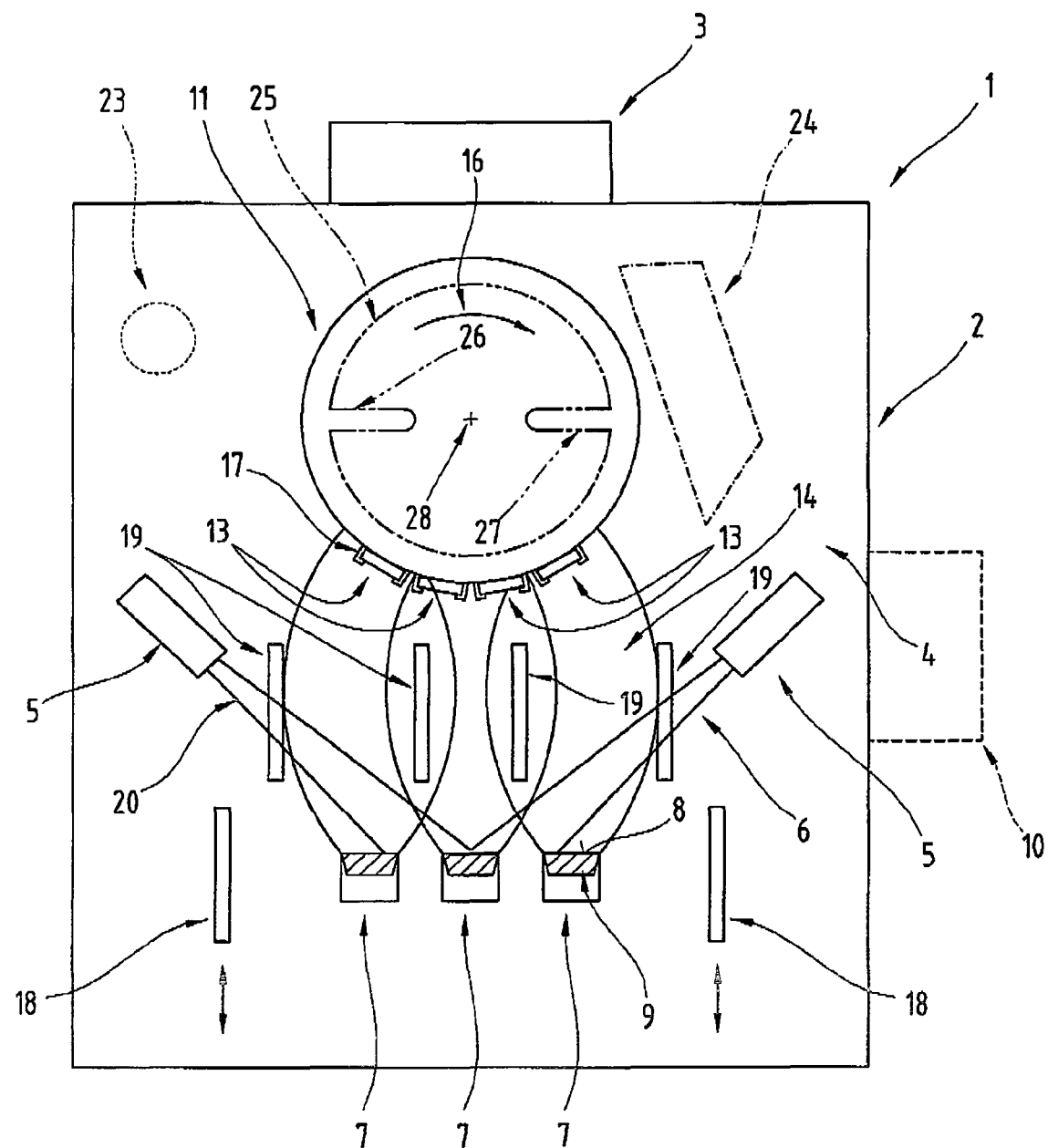
FIG. 1 embodiments of a coating device proposed by the invention.

Firstly, it should be pointed out that the same parts described in the different embodiments are denoted by the same reference numbers and the same component names and the disclosures made throughout the description can be transposed in terms of meaning to same parts bearing the same reference numbers or same component names. Furthermore, the positions chosen for the purposes of the description, such as top, bottom, side, etc., relate to the drawing specifically being described and can be transposed in terms of meaning to a new position when another position is being described. Individual features or combinations of features from the different embodiments illustrated and described may be construed as independent inventive solutions or solutions proposed by the invention in their own right.

All the figures given with respect to ranges of values in this description should be construed as including any and all part-ranges thereof. For example, the expression "1 to 10" should be interpreted as including all part-ranges, starting from the lower limit 1 and included within the upper limit 10, i.e. all part-ranges starting with a lower limit of 1 or more and ending with an upper limit of 10 or less, e.g. 1 to 1.7 or 3.2 to 8.1 or 5.5 to 10.

FIG. 1 illustrates various embodiments of a coating device 1 proposed by the invention in the form of a vacuum vapor deposition system. It comprises a housing 2 which can be evacuated, on or in which at least one gate 3 is disposed for gating in and/or gating out objects to be coated in an interior 4 of the coating device 1, as well as at least one vacuum pump.

Disposed in the interior 4 of the housing 2 in this embodiment are two energy sources 5 in the form of electron beam evaporators. Naturally, it would also be possible to provide only one of these energy sources 5 or more than two of them, especially as using an energy source 5 in the form of an electron beam evaporator means that an energy beam 6 from the energy source 5 can be deflected by magnetic fields so that, if appropriately controlled, it is possible to operate with only one energy source 5 and the energy beam 6 can be deflected by a moving beam process onto several evaporation sources 7, i.e. onto a surface 8 of a metal 9 to be evaporated which is disposed in it. Alternatively, however, it would also be possible to provide a separate energy source 5 for every individual evaporation source 7, i.e. an appropriate pan, and the energy beams could also be bundled, for example in order to increase the energy output, for one evaporation source 7 only, which incorporates several energy sources 5.

For control purposes, the coating device 1 may be provided with a control and/or regulating unit (not illustrated), and it should be pointed out at this stage that other components of the coating device 1 may naturally also be connected to it.

In terms of energy source(s) 5, all known electron beam sources may be used in principle, preferably axial electron guns. These may have an output of several 100 kW, e.g. 600 kW.

The energy source(s) 5 is/are preferably disposed in a lateral region of the interior 4 of the housing 2 but may naturally be disposed at any other point in the housing 2, optionally in separate mounts 10 provided on the housing 2 for this purpose (indicated by broken lines in FIG. 1), in order to make accessibility to these energy sources 5 easier, e.g. for maintenance purposes, since it is only necessary to ensure that the energy beam 6 is able to reach the surface 8 of the target, i.e. metal, contained in the pan, i.e. the evaporation source 7.

The evaporation sources 7 with the metal 9 contained in them are disposed underneath a substrate holder 11. In the particular embodiment illustrated, there are three evaporation sources 7, although the invention is naturally not restricted to this number, which will depend on how many individual materials, i.e. components, will be used to build a metal coating 12 (see FIG. 2) during the coating process. Another possible option is to use several evaporation sources 7 containing the same metal 9, i.e. the same coating material, to build the metal coating 12, thereby enabling several preliminary products 13 to be coated simultaneously as the substrate holder 11 is rotated, given that a particle flow 14 generated by applying energy from the energy source 5 into the coating material, in other words the metal 9 in the embodiment illustrated, assumes the form of a vapor beam 15 and has an infinite extension, which means that it may be of advantage under certain circumstances to dispose several evaporation sources 7 containing the same metal 9 adjacent to one another, thereby generating several vapor beams 15 adjacent to one another.

It may be possible to heat the evaporation sources 7, e.g. electrically, and or cool them, e.g. with a fluid such as water, air. etc., for example. Other than applying the metal 9 discontinuously, it is also possible to introduce it as a free-flowing material, or as a continuous strand or wire across the base of the pan, for example.

Figure 2:
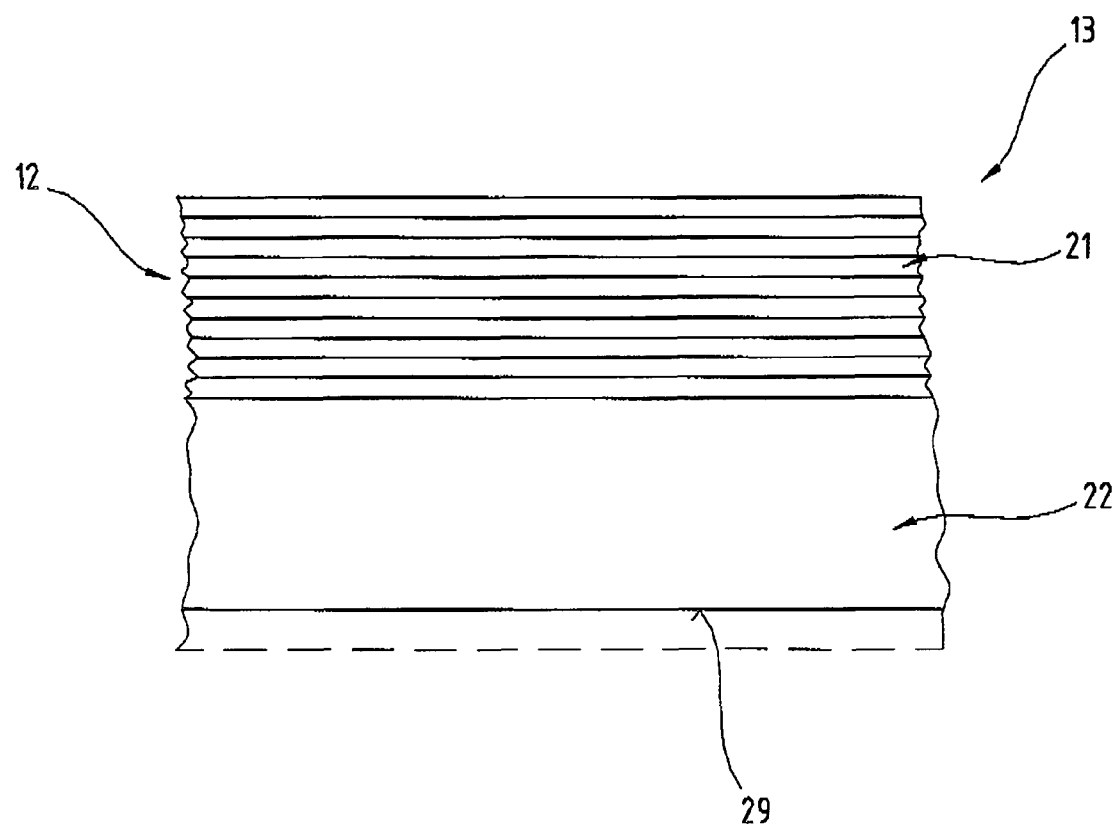
FIG. 2 a detail from a preliminary product proposed by the invention.

The substrate holder 11 disposed above the evaporation sources 7 in the particular embodiment illustrated is drum-shaped and is connected to or provided with a drive enabling a rotating movement as indicated by arrow 16. On it, several preliminary products 13 are preferably distributed and retained about the circumference of the substrate holder 11, and if necessary, appropriate adapters may be provided between the substrate holder 11 and the preliminary products 13, for example to compensate for the surface curvature of the substrate holders 11, because flat preliminary products 13 of the type illustrated in FIG. 2 are produced using the method and the coating device 1 proposed by the invention.

To hold the preliminary products 13 stationary on the surface of the substrate holders 11, retaining mechanisms 17, such as springs, retaining brackets, etc., may be provided on the substrate holder 11, for example, and under certain circumstances, at least the surface of the substrate holder 11 may be magnetic—provided this will not have a detrimental effect on the energy beam 6—in order to hold the objects coated with metal on it. In this case, this arrangement may be provided at set distances or, as is the case in a preferred embodiment, these retaining mechanisms 17 may be mounted so as to be displaceable along the circumference of the substrate holder 11, for example to hold and produce preliminary products 13 of different sizes. Appropriate recesses may be provided in the surface of the substrate holder 11 for this purposes, for example, in which these retaining mechanisms 17 are displaceably retained for example, or several bores may be distributed across the surface of the substrate holder 11 in the form of a perforated strip, in which case it will preferably be possible to close them whenever no retaining mechanisms 17 are disposed in them, thereby preventing metal material from being applied to or deposited on these bores or orifices or perforations.

Screens 18 or so-called aperture screens may be disposed between the energy source(s) 5 and the evaporation sources 7, in which case a separate screen 18 is provided for every energy source 5. Accordingly, the energy beam 6 can be totally or partially screened, for example in order to permit a specific coating sequence, so that if different metals 9 are placed in the evaporation sources 7, i.e. the pans, for example, at least individual ones of these metals 9 can be screened out during deposition, thereby enabling a specific alloy composition or coating composition to be created or different coatings. The screens 18 are preferably water-cooled in order to disperse the energy transmitted to the screens 18 by the energy beams 6. It would naturally also be possible to use any other type of cooling suitable for this purpose. The screens 18 may also be of any design, e.g. flat and linearly displaceable, split into two and pivotable, etc.

In the case of the particular embodiment of the inventive coating device 1 illustrated here, at least one ionization source 19 is provided between the evaporation sources 7 and the substrate holder 11, the term "between" as used in the context of the invention also including a lateral region, as is the case with the two respective outermost ionization sources 19 illustrated in FIG. 1.

The ionization source 19 in the embodiment illustrated as an example here is provided in the form of electrodes 20. As mentioned above, they are disposed between the evaporation sources 7 and the substrate holder 11 and to the side of the particle flow 14 in the form of the vapor beam 15 and between the evaporation sources 7 and the substrate holder 11 and/or within this/these vapor beam(s) 15, as may be seen from FIG. 1. With the aid of these ionization sources 19, at least some of the particle flow 14, i.e. the particles contained in it, can be ionized, so that the resultant acceleration of the particles in the direction towards the substrate surface and the surface of already existing individual coatings 21 (see FIG. 2) creates a very dense structure of the coating 12 on a substrate 22 (see FIG. 2), simultaneously making a high deposition rate possible due to the faster transmission of energy into the metal or metals 9 via the energy sources 5 due to the higher energy in the particles.

By adopting this approach, therefore, an appropriate coating with a homogeneous distribution of the coating material can be created on the substrate 22 in relatively short periods.

Instead of the electrodes 20, however, the ionization source 19 may also be provided by means of a laser, for example, and other ionization sources known from the prior art may also be used, in which case combinations of several different ionization sources 19 may also be used, for example the electrodes 20 with a laser.

With the aid of the ionization sources 19, it is possible to cause eddying in the evaporated material or metal 9, i.e. the particles in the particle flow 14, between the electrodes 20, for example, at least to a certain extent, which enables the homogeneity of the deposited material to be further improved.

In addition or as an alternative, it is also possible to apply a so-called bias voltage to the substrate holder 11, thereby generating an electric and/or electromagnetic field between it and the evaporation sources 7 in order to accelerate the particles, i.e. the particles of the vapor flow, in which case the voltage can be controlled and/or regulated by the control and/or regulating unit in terms of the voltage curve during the course of the coating method.

The homogeneity of the coating 12 and individual coatings 21 can also be increased by controlling the temperature accordingly depending on the coating material used, and the coating rate can be increased, and, this being the case, it is of advantage to use electron beam evaporators as the energy source 5 because this provides a more efficient means of controlling the specific local temperature and hence also the specific local evaporation rate of the metal or metals 9, partially screening the energy beam 6 with the aid of the screens 18 if necessary.

To improve the quality of the coating 12 and the individual coatings 21 still further and thus improve adhesion, another embodiment of the invention is possible whereby a magnetron 23, in particular a cathode sputtering magnetron, or more generally an ion source, is connected downstream of the evaporation sources 7 in the direction in which the substrate holder 11 rotates, indicated by arrow 16, as indicated by broken lines in the top left-hand quadrant of the housing 2 in FIG. 1. This enables the coating 12 and the individual coatings 21 to be bombarded with high-energy particles. In addition to generating ions for bombardment purposes, this magnetron 23 or this ion source may also be used to produce an intermediate coating, for example a diffusion barrier coating, which may be applied between the substrate 22 and the coating 12 or individual coatings 21. This also enables metals to be incorporated in the coating 12 or individual coatings 21 in a very low concentration. In this manner, a sputter source may be used to incorporate trace elements in the coating 12, such as Zr, Sc, etc., for example, which are very difficult to incorporate in such low concentrations using fusion metallurgy.

This also enables a further compaction of the coating structure of the individual coatings 21 or the coating 12.

However, a magnetron 23 of this type may also be used for the ionization sources 19.

Amongst other things, higher hardness values can also be obtained in the individual coatings 21 and the coating 12.

Within the context of the invention, it is also possible to subject the surface of the substrate 22 to an initial treatment, as shown by broken lines in the top right-hand quadrant of the housing 2 of the coating device 1 illustrated in FIG. 1 indicating a pre-treatment device 24. This pre-treatment device 24 may be provided in the form of an etching device, in a manner known from the prior art, for example with thermionic cathodes, or sputter etching, diode sputtering, plasma activation, corona discharge activation. Depending on the circumstances, another pre-treatment may be operated prior to this surface treatment or activation of the surface of the substrates 22, e.g. in the form of grease removal or a general cleaning of the substrates 2.

In another embodiment of the coating device 1 proposed by the invention, the substrate holder 11 is designed so that it can be heated. To this end, a heating and/or cooling system 25 may be provided in the interior of the drum-shaped substrate holder 11 in order to maintain the surface of the substrate holder 11 and hence the substrate 22 at a specific temperature level and to apply a coating with a defined temperature curve. As indicated by dashed-dotted lines, this heating and/or cooling system 25 may be provided in the form of a heating and/or cooling jacket, for example, in which case appropriate connectors are provided for an inlet 26 and an outlet 27, which are connected to an appropriate supply system (not illustrated in FIG. 1). Oil, water or air may be used for cooling purposes, for example, in which case a heat exchanger may provided in conjunction with this heating and/or cooling system 25 in order to recycle energy.

The coating method can therefore be run on the basis of an exact temperature control, thereby enabling also enabling a homogeneous structure of the coating 12 and individual coatings 21 to be obtained on the basis of this coating temperature and the coating temperature curve, in which case the ionization sources 19 described in connection with the first variant of the coating device 1 can be dispensed with.

Alternatively or in addition to this heating and/or cooling system 25 with circulating fluid, it would also be possible to provide resistance heating in the form of a filament in the interior of the substrate holder 11, for example.

FIG. 2 illustrates a detail of a preliminary product 13 produced with the coating device 1 illustrated in FIG. 1. It comprises the substrate 22 and the coating deposited on it. The coating 12 consists of individual coatings 21, although this is only indicated in FIG. 2. Using the invention, between 50 and 5000, in particular 100 and 4000, preferably 250 and 2500, individual coatings 21 can be applied to the metal substrate 22 in the case of one embodiment.

Although the individual coatings are shown as being discrete in FIG. 2, it may be that these individual coatings 21 are no longer distinguishable, at least macroscopically, depending on how the method is operated, for example if during a rest phase of the coating method, in other words if the substrate 22 is conveyed out of the particle flow 14 or the vapor beam(s) by rotating the substrate holder 11, a diffusion of at least some of the individual elements of the individual coatings 21 takes place, thereby resulting in a sort of "intermixing" effect.

With the high-rate vapor deposition process proposed by the invention, thick coatings can be produced and the coating 12 has a coating thickness of >100 µm, in particular >150 µm, preferably >200 µm. The individual coatings 21 may have a thickness selected from a range with a lower limit of 10 nm and an upper limit of 10 µm. This coating thickness of the individual coatings 21 may depend on the deposition rate and the amount of energy transmitted to the evaporation sources 7 and the amount of kinetic energy transmitted to the particles by means of which they are accelerated towards the surface of the substrates 22. This coating thickness may also depend on the respective temperature applied.

A steel strip is preferably used as the substrate, of the type used as standard for the production of bearing elements, such as plain bearings for example, in particular plain bearing half-shells, given that the coating method proposed by the invention is used for producing preliminary products intended for manufacturing bearing products.

However, instead of using steel strip as the substrate 22, it is also possible to work with a composite material such as a Cu—Pb—Sn composite material, steel/aluminum or steel/white metal composite material.

After a sputtering process, a PVD or galvanic process, an agent to impart adhesion or an adhesion coating may be applied to the metal substrate 22, for example—although this is not absolutely necessary for the purpose of the invention—such as AlCu10, or some other functional coating, for example, used as standard for bearing elements.

Such functional coatings might be diffusion barrier coatings, for example, to prevent the possibility of constituents diffusing between the coating 12 and the substrate 22 or another functional coating provided underneath the diffusion coating. It is naturally also possible to apply such coatings beforehand, for example by a plating or rolling process of the type known from the prior art, for example. The materials which may be used for such intermediate coatings are nickel, nickel-chromium, nickel-copper alloys, for example, such as CuSn, CuBe, AlZn, AlSn, AlSi, CuAl, CuAlFe, CuSnZn, CuZn.

In general, the preliminary product 13 may be made up of two or more layers—apart from the coating 12 and the individual coatings 21—in which case at least one other coating is provided between the substrate 22 and the coating 12.

The coating 12 and individual coatings 21 may form alloys of the following type, for example: $AlSn_xCu$, $AlSn_xSi$, $AlPb_x$, $CuSn_x$, $CuBi_x$, $SnAl_x$, $SnSb_x$, AlSn, AlCu, AlSi. Although this is not intended to restrict the invention in any way, x may be a number selected from a range of from 1 to 30, in particular 3 to 25, preferably 6 to 20. For example, alloys or individual coatings 21 for the coating 12 which may be formed in the AlSnCu range are AlSn6, AlSn50Cu1, SnAl6, whilst for the AlSnSi system they may be AlSn6Si2, AlSn25Si8, SnAn20Si2, and in the CuSn system CuSn12, SnCu6, in the CuPb system CuPb5, CuPb50, PbCu6, as well as in the CuPbSn system CuPb10Sn2, CuPb30Sn6, PbCu6Sn2, and every intermediate stage between the individual alloys is likewise possible. To this end, appropriate metals 9 may be placed in the evaporator sources 7, on the one hand, constituting a base element selected from a group comprising aluminum, zinc, copper, lead, as well as another element selected from a group comprising lead, tin, bismuth, zinc, silicon, magnesium, manganese, iron, scandium, zirconium, beryllium, chromium, copper, aluminum, provided the alloying element is not the same as the base element.

For the coating method proposed by the invention, it is preferable to use pure chemical elements, i.e. pure metals 9, with an appropriate degree of purity so that an alloy is able to form firstly in the particle flow 14 and by depositing the individual particles from the vapor beam(s) on the surface of the substrates 22 and individual coatings 21, after which a diffusion takes place. It is also possible to use so-called secondary metals from recycling processes.

In order to improve the properties of the individual coatings 21 or the coating 12, it is of advantage if it is produced with a surface roughness which is smaller than a surface roughness of the substrate 22, although this does not necessarily mean, within the context of the invention, that this surface roughness is produced during the actual coating process itself, i.e. in the particle flow 14 by depositing the particles on the substrate surface, but instead it may be that roughness is imparted to the surface during a subsequent rest phase, e.g. by bombarding the surface with ions as mentioned above. However, no mechanical processing takes place for this purpose.

It is also possible to use a substrate 22 with a deviation from a mean substrate thickness, which is not greater than 200 μm, in particular not greater than 150 μm, preferably not greater than 100 μm.

As mentioned above, the coating, i.e. the coating 12 may be rendered homogeneous and this may take place in the particle flow 14 already or alternatively during subsequent diffusions operations outside of the particle flow 14. In accordance with the invention, it is also possible to create a pronounced multi-layered structure, as indicated in FIG. 2, for example, in which case there may be homogeneity on a macroscopic level, in other words the composition of the individual coatings 21 between individual coatings may vary in order to obtain a specific behavior or appropriate properties of the preliminary products 13. This multi-layered structure may be created by an appropriate temperature curve using the coating device 1 proposed by the invention, in particular by means of the heating and/or cooling system 25, and this will depend on what metals 9 are used to form the coating. Diffusion behavior can also be influenced via the temperature or temperature curve, which is set using this heating and/or cooling system 25, and a multi-layered structure can be created, assisted by appropriate controls.

Although the main purpose of the invention is to produce homogeneous, dense coatings 12 and dense coatings 12 with a multi-layered structure, it may be of advantage if a certain amount of residual porosity is imparted to at least one of the individual coatings 21, especially in areas close to the surface, i.e. in those areas which will be in contact with a part to be supported, in particular a shaft, during the ultimate use of the preliminary product 13 as a bearing element, in order to accommodate lubricant, e.g. a lubricating oil. For example, pores may be created with a mean pore diameter selected from a range with a lower limit of 0.1 μm and an upper limit of 10 μm. This residual porosity may be obtained during a subsequent process step during which other remaining individual coatings 21 still to be applied are deposited with the substrate holder 11 rotating at a higher speed, thereby preventing a "continuous" individual coating 21 from forming. In addition or as an alternative, it is also possible to pre-set an appropriate temperature curve from the coating device 1 proposed by the invention so that, at a reduced temperature and due to the lesser amount of energy transmitted to the particles, the latter move less so that a diffusion or compensation or homogenization of the individual coatings 21 is delayed or less advanced.

Using the coating method proposed by the invention. it is also possible to incorporate elements or metals 9 in the or at least one of the individual coatings 21 in extremely low quantities, i.e. concentrations, such as zirconium, scandium, yttrium, etc., for example in a concentration of 0.01 to 0.1%. These metals 9 may be placed in the evaporation sources 7 already or introduced into the coating 12 from an additional source during a subsequent step, e.g. an appropriate cathode. It is therefore also possible to introduce trace elements which, in these low concentrations, can not be economically incorporated in alloys using fusion metallurgy techniques.

By using additional sources in the so-called non-deposition phase, a chemical reaction may also take place, in particular as a means of applying special coatings, such as hardening coatings, such as nitride, boride or oxide coatings, etc.

Accordingly, it is also possible to harden an individual coating 21 on the substrate surface in order to create a hardness gradient in the coating 12, for example.

A concentration gradient can be created for at least individual metals 9 within the coating 12 and individual coatings 21 by controlling the method accordingly, i.e. by transmitting energy into the evaporation sources 7 accordingly or by screening individual evaporation sources 7 or, if using magnets to deflect the energy beam 6, by controlling these magnets accordingly.

It is also possible to control the coating method in such a way that components are deposited in the coating 12 or in at least an external individual coating 21 of the coating 12, which undergo a phase transformation during subsequent service of the bearing element produced from the preliminary product 13, thereby imparting better resistance to galling in the event of an emergency temperature in the bearing than would be the case at a higher temperature in applications involving bearing elements.

The method proposed by the invention may be operated in such a way that a voltage for generating the electric field between the substrate holder 11 and the evaporation sources 7 is selected from a range with a lower limit of 10 V and an upper limit of 800 V, preferably with a lower limit of 50 V and an upper limit of 600 V, in particular with a lower limit of 100 V and an upper limit of 400 V.

Furthermore, the metal substrate 22 may be heated to a temperature which is at least 10° C. below the melting point of the elements to be deposited which have the lowest melting point, in which case this heating operation is run before the start of the coating process.

By controlling the temperature accordingly, the properties of the coating 12 may be influenced. For example, amorphous coatings can be formed at lower temperatures, whilst a "more structured" coating 12 can be formed at an increased temperature. Naturally, it would also be possible, within the scope of the invention, to operate on the basis of an appropriate temperature curve during the coating method so that both amorphous as well as non-amorphous individual coatings 21 can be formed and all other transition phases in between.

The properties of the coating 12 can also be influenced on the basis of the deposition rate of the particles from the particle flow 14, in which case this deposition rate may be selected from a range with a lower limit of 0.01 μm/sec and an upper limit of 0.1 μm/sec, preferably with a lower limit of 0.03 μm/sec and an upper limit of 0.07 μm/sec, in particular with a lower limit of 0.05 μm/sec and an upper limit of 0.06 μm/sec.

Accordingly, the substrate holder 11 may be operated at a speed selected from a range with a lower limit of 0.01 m/sec and an upper limit of 10 m/sec, preferably with a lower limit of 1 m/sec and an upper limit of 7 m/sec, in particular with a lower limit of 3 m/sec and an upper limit of 6 m/sec. The method may also be operated at a pressure selected from a range with a lower limit of $1.10^{-7}$ mbar and an upper limit of $2.10^{-2}$ mbar, preferably with a lower limit of $1.10^{-6}$ mbar and an upper limit of $2.10^{-3}$ mbar, in particular with a lower limit of $1.10^{-5}$ mbar and an upper limit of $2.10^{-4}$.

Naturally, the individual parameters may be adapted with respect to one another and the parameters varied during the coating process.

The component or components forming the phase transformation may be selected from a group of compounds made up of elements from a group comprising tin, silver, copper, aluminum, manganese, magnesium, lead, beryllium as well as mixtures thereof.

The properties may also be influenced on the basis of a distance between the substrate holder 11 and the evaporation sources 7, and the deposited quantity can be varied by immersing the substrate 22 in the vapor beam 15 fewer times or more times.

The distance of the evaporation sources 7 from one another may be used to achieve a bigger or smaller overlapping region between individual vapor beams 15 and this distance can therefore be used to obtain a greater or lesser degree of intermixing of the individual particles from the different evaporation sources 7. Another possible option is to vary this distance and the distance of the evaporation sources 7 from the substrate 22 during the coating process, for example by making the evaporation sources 7 height adjustable or laterally displaceable, in which case they could be connected to a motor, e.g. a stepper motor.

Based on an appropriate choice of parameters or more generally using the coating method proposed by the invention, the individual coatings 21 can be deposited with a view to producing very finely grained preliminary products 13 with an extremely high resistance to stress, and, as mentioned above, the preliminary treatment has no or negligible side-effects, as tests have shown, and this prior treatment can therefore be very easily incorporated, for example in the form of a simple cleaning process, which in turn makes the method very cost effective.

The substrate 22 may be heated at the start and then cooled during subsequent stages of the coating method in order to maintain it at a specific temperature level.

This enables an appropriate thermal equilibrium to be achieved and hence a corresponding structure (variation) to be obtained.

A thermal equilibrium can also be set on the basis of the rotation speed of the substrate holder 11 so that the condensation heat is set to match the heat loss due to radiation.

An adhesion coating may be applied using sputter cathodes, if this is desirable.

Since the evaporation sources 7 are of a finite size, it is proposed as part of the invention that, to enable larger substrates 22 to be handled, the substrate holder 11 should be designed so that it is linearly displaceable, for example in the direction of a rotation axis 28 of the substrate holder 11. This will make it possible to apply coating in a spiral shape over larger surfaces.

In this respect, in order to produce more homogeneous coatings 12, it is of advantage if the movement caused by rotation and the linear movement are adapted with respect to one another so that the sections of coating applied overlap with one another, at least in peripheral regions.

As indicated by the broken lines in FIG. 2, at least one additional functional coating may be applied to an untreated surface 29 of the substrates 22, i.e. the surface on the substrate 22 lying opposite the coating 12, such as a coating to protect against corrosion, for example, in particular a coating to prevent wear due to friction, such as a coating of CuSn6 or CuSn, etc. The coating proposed by the invention may also be applied on two sides, in other words an anti-friction layer for a bearing element may be formed on this second surface, for example.

Figure 3:
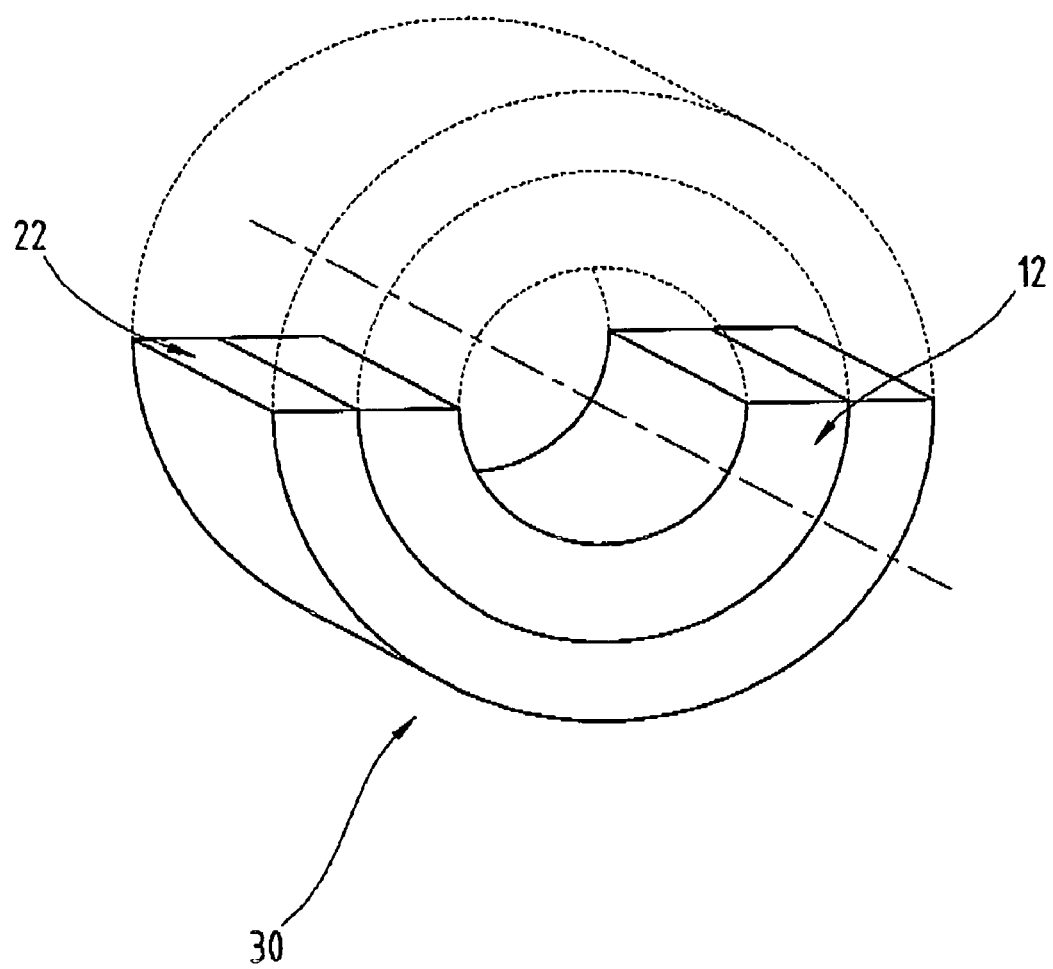
FIG. 3 a bearing element in the form of a plain bearing half-shell, made from the preliminary product.

FIG. 3, finally, shows the preferred application of the preliminary products 13 illustrated in FIG. 2 in the form of a bearing element, in particular a plain bearing half-shell 30. It is produced by subsequently shaping or forming the preliminary product 13 and comprises the substrate 22 as well as at least the coating 12.

However, it should be pointed out that the method proposed by the invention is not restricted to preliminary products 13 of this type only and it is also possible to produce anti-wear coatings, anti-corrosion coatings on metal substrates 22 generally.

The bearing element proposed by the invention may also be in the form of a full bearing, a bearing bush, etc.

In bearing elements of this type, the coating 12 has a slimmer thickness and, under certain circumstances, up to 60% of the original coating thickness may be lost due to compression or more generally due to the forming process. For this reason, it is not absolutely necessary to ensure that a regular coating thickness is produced for the individual coatings 21.

Figure 4:
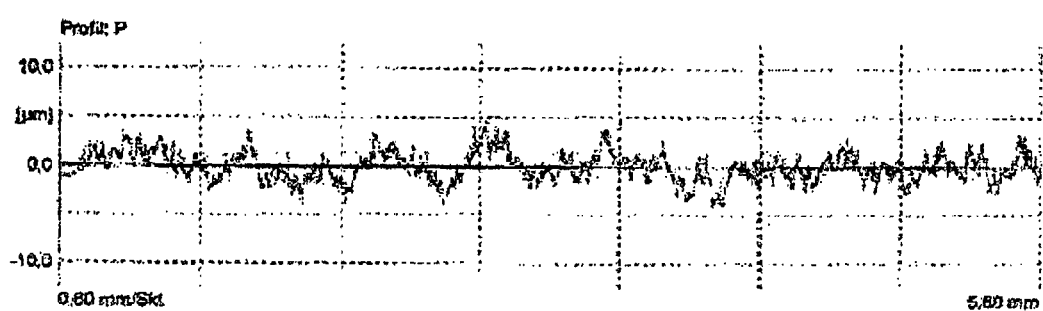
FIG. 4 a roughness profile of a surface of a preliminary product.
Figure 5:
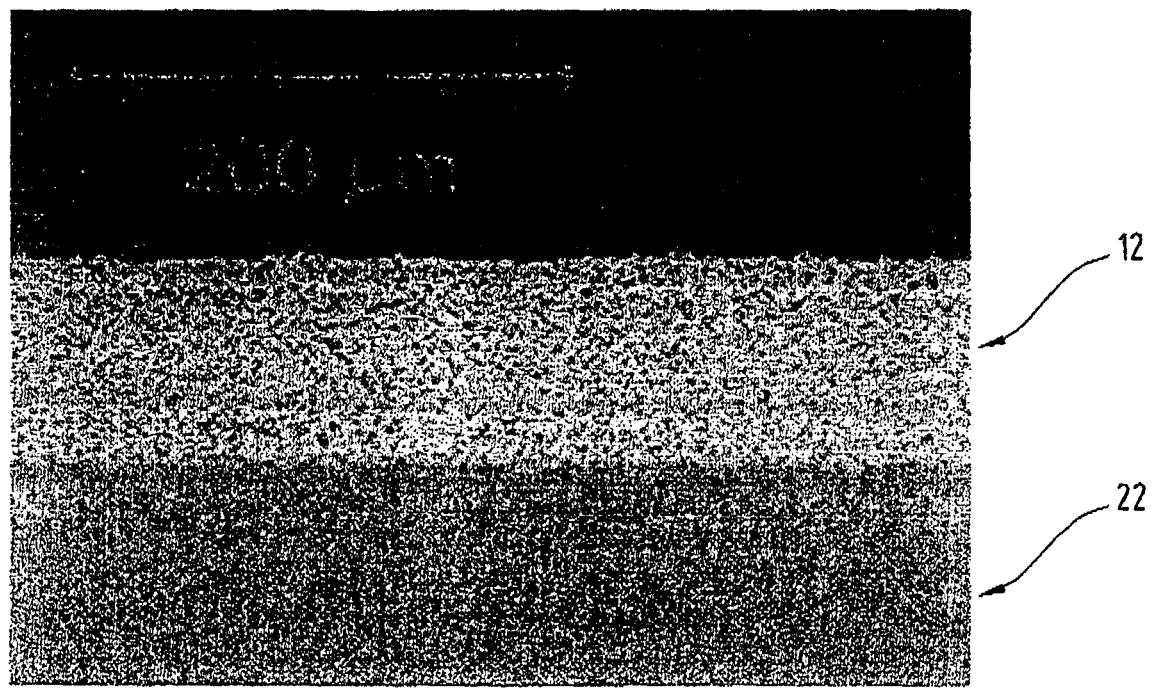
FIG. 5 a micro-graph showing the pattern of a preliminary product.
Figure 6:
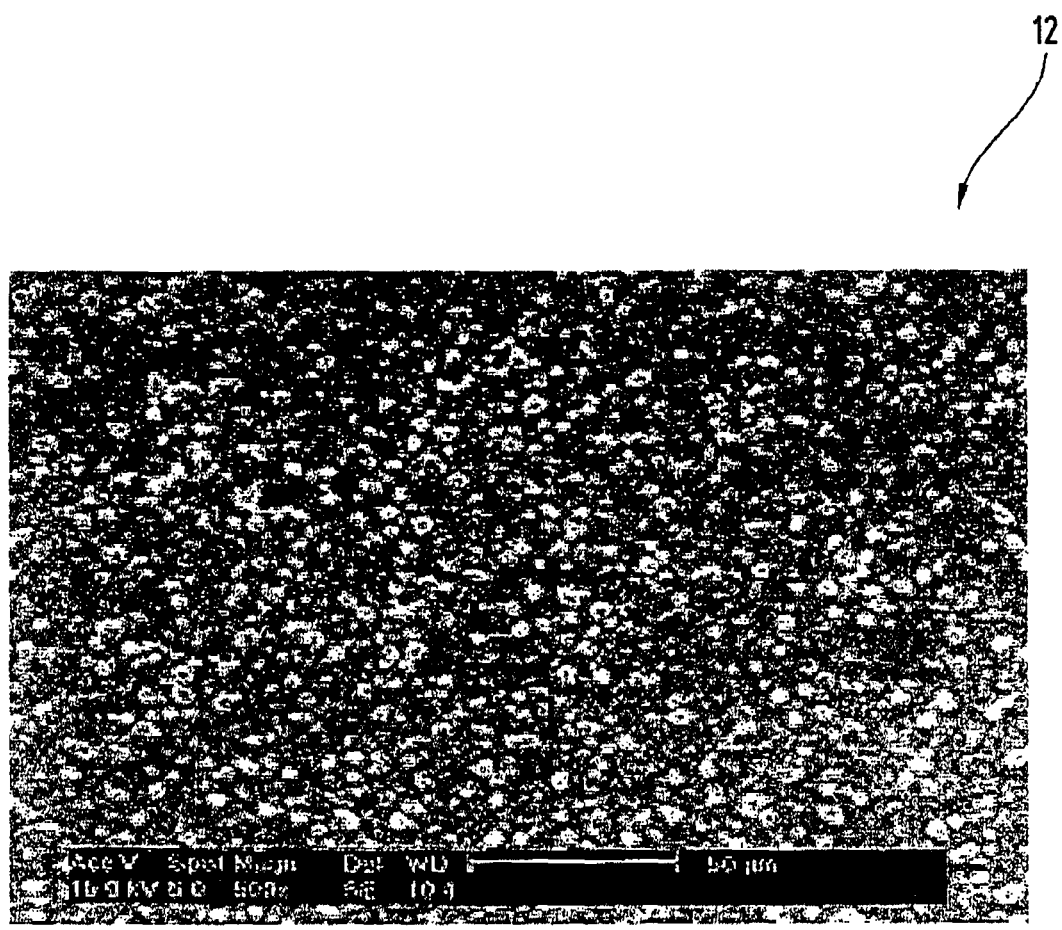
FIG. 6 a raster electron microscope image of the surface with a magnification factor of 500.

FIGS. 4 to 6, finally, illustrates a roughness profile on the one hand and a micro-graph of a structure, as well as a raster electron microscope image of a surface of the coating 12 of a preliminary product 13 of the type produced by the invention and illustrated in FIG. 2. It comprises a substrate 22 in the form of a steel strip and an AlSn20Cu alloy forming the coating 12. The steel strip in this instance has dimensions of 3000×260×3 mm and was disposed on the substrate holder 11 illustrated in FIG. 1 with a diameter of 1000 mm. 100 individual coatings 21 were produced, each with a thickness of 1 μm at a temperature of 150° C.

As may be seen in particular from FIG. 4, a very even surface of the coating 12 was produced, an arithmetic mean roughness value Ra in accordance with DIN EN ISO 4287 being 0.951 μm and a maximum roughness profile height Rz in accordance with DIN EN ISO 4287 being 6.287 μm respectively R3z 4.843 μm.

As may be seen from FIG. 5, the coating 12 has a homogeneous structure and under the light microscope none of the individual coatings is distinguishable from the others. As may also be seen from this Figure, although no coating was applied as a means of imparting adhesion, there are no adhesion faults between the substrate 22 and the coating 12.

Both FIG. 5 and FIG. 6 show the fineness of the grains of the surface of the coating 12, the pattern shown in FIG. 5 being non-etched and the raster electron microscope of the surface shows an enlargement with a magnification factor of 500.

The total thickness, which may be seen in FIG. 5, is between 90 and 91 μm.

The AlSn20Cu-coating has the following values in terms of micro-hardness:

39,1/38,8/39,2/38,7/38,8 UMHV5p 37,4/38,3/38,5/36,5/37,9 UMHV10p

The hardness figures are based on a Vickers micro-hardness measurement with 0.0005 respectively 0.001 Kilopond test force in accordance with the DIN EN ISO 6507-1 standard.

The hardness based on Vickers was measured as being HV>50.

However others coatings 12 were produced which had a hardness of HV>60 in other tests.

The composition of the coating 12 was measured in 10 zones, producing the following results:

|  | Al<br>% by weight | Sn<br>% by weight | Cu<br>% by weight |
| --- | --- | --- | --- |
| Zone 1 | 83.17 | 15.52 | 1.31 |
| Zone 2 | 83.47 | 14.30 | 2.22 |
| Zone 3 | 84.06 | 14.93 | 1.10 |
| Zone 4 | 80.58 | 18.12 | 1.30 |
| Zone 5 | 84.71 | 14.32 | 0.97 |
| Zone 6 | 76.88 | 21.88 | 1.25 |
| Zone 7 | 81.61 | 16.57 | 1.76 |
| Zone 8 | 82.24 | 17.37 | 0.39 |
| Zone 9 | 78.97 | 19.62 | 1.41 |
| Zone 10 | 78.76 | 17.92 | 0.85 |

As documented by the individual measurement values, therefore, a very homogeneous, uniform coating 12 can be produced using the coating method proposed by the invention, even in non-optimised initial tests.

It should generally be pointed out that, using the method proposed by the invention, coatings 12 deposited from the gas phase can be produced which, compared with coatings of the same composition applied by sputtering, have a lesser hardness, based on Vickers, by 30%, in particular 35%, preferably 40%. The coating 12 proposed by the invention has a higher elongation at break due to the fact that is tougher than coatings applied by sputtering.

Coatings 12 can also be produced which—compared with sputter coatings—do not contain any trace elements from the evaporation source 7.

In addition, lead-free coatings can be produced inexpensively.

The embodiments illustrated as examples show possible design variants of the coating device 1 and the preliminary products 13 and it should be pointed out at this stage that the invention is not restricted to the various embodiments illustrated here, and instead the individual design variants may be used in different combinations with one another and these possible variations lie within the reach of the person skilled in this technical field given the disclosed technical teaching. Accordingly, all conceivable design variants which can be obtained by combining individual details of the design variants described and illustrated are possible and fall within the scope of the invention.

For the sake of good order, finally, it should be pointed out that, in order to provide a clearer understanding of the structure of the coating device 1 and the preliminary product 13, they and their constituent parts are illustrated to a certain extent out of scale and/or on an enlarged scale and/or on a reduced scale.

The objective underlying the independent inventive solutions may be found in the description.

Above all, the individual embodiments of the subject matter illustrated in FIGS. 1; 2; 3; 4,5, 6 constitute independent solutions proposed by the invention in their own right. The objectives and associated solutions proposed by the invention may be found in the detailed descriptions of these drawings.

| List of reference numbers | |
| --- | --- |
| 1 | Coating device |
| 2 | Housing |
| 3 | Gate |
| 4 | Interior |
| 5 | Energy source |
| 6 | Energy beam |

-continued

| List of reference numbers | |
| --- | --- |
| 7 | Evaporation source |
| 8 | Surface |
| 9 | Metal |
| 10 | Mount |
| 11 | Substrate holder |
| 12 | Coating |
| 13 | Preliminary product |
| 14 | Particle flow |
| 15 | Vapor beam |
| 16 | Arrow |
| 17 | Retaining mechanism |
| 18 | Screen |
| 19 | Ionization source |
| 20 | Electrode |
| 21 | Individual coating |
| 22 | Substrate |
| 23 | Magnetron |
| 24 | Pre-treatment device |
| 25 | Cooling system |
| 26 | Inlet |
| 27 | Outlet |
| 28 | Rotation axis |
| 29 | Surface |
| 30 | Plain bearing half-shell |

What is claimed is:

1. Coating method for producing a bearing element comprising a substrate and a ductile metal coating, whereby the metal coating of particles is deposited from the gas phase on the substrate retained by a substrate holder at a reduced pressure for making a flat preliminary product, whereby the particles are evaporated by means of at least one energy source from containers constituting at least one evaporation source, wherein the metal coating is built up of several sequentially applied individual coatings, wherein the number of individual coatings is selected from a range with a lower limit of 50 and an upper limit of 5000 to increase the homogeneity of the metal coating, and subsequently shaping or forming the preliminary product to the bearing element, wherein the bearing element is a bearing half-shell.

2. Coating method as claimed in claim 1, wherein the individual coatings are deposited on the substrate with a defined coating thickness selected from a range with a lower limit of 10 nm and an upper limit of 10 μm.

3. Coating method as claimed in claim 1, wherein the metal coating is applied with a coating thickness in excess of 100 μm.

4. Coating method as claimed in claim 1, wherein the individual coatings are applied with a surface roughness which is smaller than a surface roughness of the substrate.

5. Coating method as claimed in claim 1, wherein a substrate is used, which has a variance from a mean substrate thickness which is not greater than 200 μm.

6. Coating method as claimed in claim 1, wherein the substrate is moved several times in a cyclical, rotating or linear movement, by means of what is the same evaporation source(s).

7. Coating method as claimed in claim 6, wherein the rotating movement is combined with the linear movement of the substrates.

8. Coating method as claimed in claim 1, wherein a homogenization process is run in the metal coating and between the individual coatings outside the at least one evaporation source by means of a diffusion of at least individual constituents of the coating(s).

9. Coating method as claimed in claim 1, wherein several evaporation sources are used, each of which contains a chemical pure element for building the coating.

10. Coating method as claimed in claim 1, wherein a two-component or multi-component system is used as the metal coating, comprising a base element selected from a first group comprising aluminum, tin, copper, lead, alloyed with at least one other element selected from a group comprising lead, tin, bismuth, zinc, silicon, magnesium, manganese, iron, scandium, zirconium, chromium, copper, aluminum, beryllium, provided the other element is not the same as the base element.

11. Coating method as claimed in claim 10, wherein an alloy is formed from the components.

12. Coating method as claimed in claim 10, wherein the components are deposited one after the other in individual coatings and wherein the individual coatings are subjected to a subsequent diffusion.

13. Coating method as claimed in claim 1, wherein a coating to protect against corrosion is applied to an uncoated surface of the substrate.

14. Coating method as claimed in claim 1, wherein an agent for imparting adhesion is applied between the metal coating and the substrate.

15. Coating method as claimed in claim 1, wherein at least an outermost coating of the individual coatings is applied with a defined porosity, the porosity being obtained during a subsequent process step during which other remaining individual coatings still to be applied are deposited with the substrate holder rotating at a higher speed, thereby preventing a continuous individual coating from forming, or by pre-setting an appropriate temperature curve so that, at a reduced temperature and due to the lesser amount of energy transmitted to the particles, the particles move less so that a diffusion or compensation or homogenization of the individual coatings is delayed or less advanced.

16. Coating method as claimed in claim 15, wherein pores are created with a mean pore diameter selected from a range with a lower limit of 0.1 μm and an upper limit of 10 μm.

17. Coating method as claimed in claim 1, wherein the metal coating is provided in the form of an anti-friction layer for a bearing element.

18. Coating method as claimed in claim 1, wherein a preliminary product for a plain bearing is produced.

19. Coating method as claimed in claim 1, wherein, after applying at least one of the first individual coatings, a structural improvement of this individual coating is obtained by bombardment with high-energy particles.

20. Coating method as claimed in claim 1, wherein a proportion of the evaporated particles is ionized and these are accelerated during the deposition of the individual coatings in at least one of an electric field generated between the substrate and at least one electrode in the direction towards the surface of the substrate and the already deposited individual coatings and an electric field between the electrodes in order to create an electric field between the substrate holder and the at least one evaporator source extending approximately perpendicular to the particle flow.

21. Coating method as claimed in claim 20, wherein a voltage for creating the electric field is selected from a range with a lower limit of 10 V and an upper limit of 800 V.

22. Coating method as claimed in claim 1, wherein the metal substrate is heated to a temperature which is at least 10° C. below the melting point of the element to be evaporated which has the lowest melting point.

23. Coating method as claimed in claim 17, wherein, in order to build at least an outermost coating of the individual coatings, components intended to form meta-stable phases are deposited which undergo a phase transformation during operation of the finished bearing element below an emergency temperature.

24. Coating method as claimed in claim 23, wherein the components intended to form meta-stable phases are selected from compounds formed by elements from a group comprising tin, silver, copper, aluminum, manganese, magnesium, lead, beryllium and mixtures thereof.

25. Coating method as claimed in claim 1, wherein at least one individual coating lying on the substrate surface is hardened.

26. Method as claimed in claim 1, wherein a deposited coating or at least an individual coating is produced which, compared with coatings applied by sputtering, has a lower hardness based on Vickers by 30%.

* * * * *